United States Patent
Liang et al.

(10) Patent No.: US 9,355,924 B2
(45) Date of Patent: May 31, 2016

(54) INTEGRATED CIRCUIT UNDERFILL SCHEME

(71) Applicant: Taiwan Semiconductor Manufacturing Company, Ltd., Hsin-Chu (TW)

(72) Inventors: Shih-Wei Liang, Daija Township (TW); Chun-Lin Lu, Hsin-Chu (TW); Kai-Chiang Wu, Hsin-Chu (TW); Ching-Feng Yang, Taipei (TW); Ming-Kai Liu, Taipei (TW); Chia-Chun Miao, Hsin-Chu (TW); Yen-Ping Wang, Hemei Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 81 days.

(21) Appl. No.: 13/724,616

(22) Filed: Dec. 21, 2012

(65) Prior Publication Data

US 2014/0117555 A1    May 1, 2014

Related U.S. Application Data

(60) Provisional application No. 61/720,266, filed on Oct. 30, 2012.

(51) Int. Cl.
| | |
|---|---|
| *H01L 23/13* | (2006.01) |
| *H01L 21/56* | (2006.01) |
| *H01L 23/498* | (2006.01) |
| *H01L 23/00* | (2006.01) |

(52) U.S. Cl.
CPC .............. *H01L 23/13* (2013.01); *H01L 21/563* (2013.01); *H01L 23/49811* (2013.01); *H01L 23/49827* (2013.01); *H01L 23/49833* (2013.01); *H01L 24/73* (2013.01); *H01L 2224/16225* (2013.01); *H01L 2224/32225* (2013.01); *H01L 2224/45124* (2013.01); *H01L 2224/45144* (2013.01); *H01L 2224/45147* (2013.01); *H01L 2224/48091* (2013.01); *H01L 2224/48227* (2013.01); *H01L 2224/73204* (2013.01); *H01L 2224/73265* (2013.01); *H01L 2224/83385* (2013.01); *H01L 2225/1023* (2013.01); *H01L 2225/1058* (2013.01); *H01L 2924/15311* (2013.01); *H01L 2924/15331* (2013.01)

(58) Field of Classification Search
CPC ....... H01L 23/13; H01L 21/563; H01L 21/56; H01L 23/49827; H01L 23/49811
USPC ........................................... 257/773; 438/126
See application file for complete search history.

(56) References Cited

U.S. PATENT DOCUMENTS

| | | | |
|---|---|---|---|
| 2008/0303173 A1 | 12/2008 | Hamada et al. | |
| 2009/0057864 A1* | 3/2009 | Choi et al. | 257/686 |
| 2010/0320587 A1* | 12/2010 | Lee et al. | 257/690 |
| 2011/0260338 A1* | 10/2011 | Lee et al. | 257/778 |
| 2011/0316162 A1* | 12/2011 | Ko et al. | 257/773 |
| 2012/0049353 A1* | 3/2012 | Osenbach | 257/737 |

* cited by examiner

*Primary Examiner* — Walter H Swanson
(74) *Attorney, Agent, or Firm* — Slater Matsil, LLP

(57) ABSTRACT

An integrated circuit includes a substrate having at least one depression on a top surface. At least one solder bump is disposed over the substrate. A die is disposed over the at least one solder bump and electrically connected with the substrate through the at least one solder bump. An underfill surrounds the at least one solder bump and is formed between the substrate and the die. The at least one depression is disposed around the underfill to keep any spillover from the underfill in the at least one depression.

14 Claims, 3 Drawing Sheets

INTEGRATED CIRCUIT UNDERFILL SCHEME

This application claims the benefit of U.S. Provisional Application Ser. No. 61/720,266, filed on Oct. 30, 2012, entitled "Integrated Circuit Underfill Scheme," which application is hereby incorporated herein by reference.

TECHNICAL FIELD

The present disclosure relates generally to an integrated circuit and more particularly an underfill scheme.

BACKGROUND

In some integrated circuit packaging, underfill material is used to fill the space between a chip and a substrate on which the chip is mounted with solder bumps. The underfill protects the solder bumps from moisture or other environmental hazards, and provides additional mechanical strength to the assembly as well as compensates for any thermal expansion difference between the chip and the substrate. However, the underfill material can overflow outside the intended area and the spillover can contaminate the package on package (PoP) pad for solder bumps on the substrate. Some packages use damming material outside the underfill to block the overflow, which incurs additional cost and less accuracy of width/height control due to soft liquid damming material and tool tolerance.

BRIEF DESCRIPTION OF THE DRAWINGS

Reference is now made to the following descriptions taken in conjunction with the accompanying drawings, in which.

DETAILED DESCRIPTION

Figure 1:
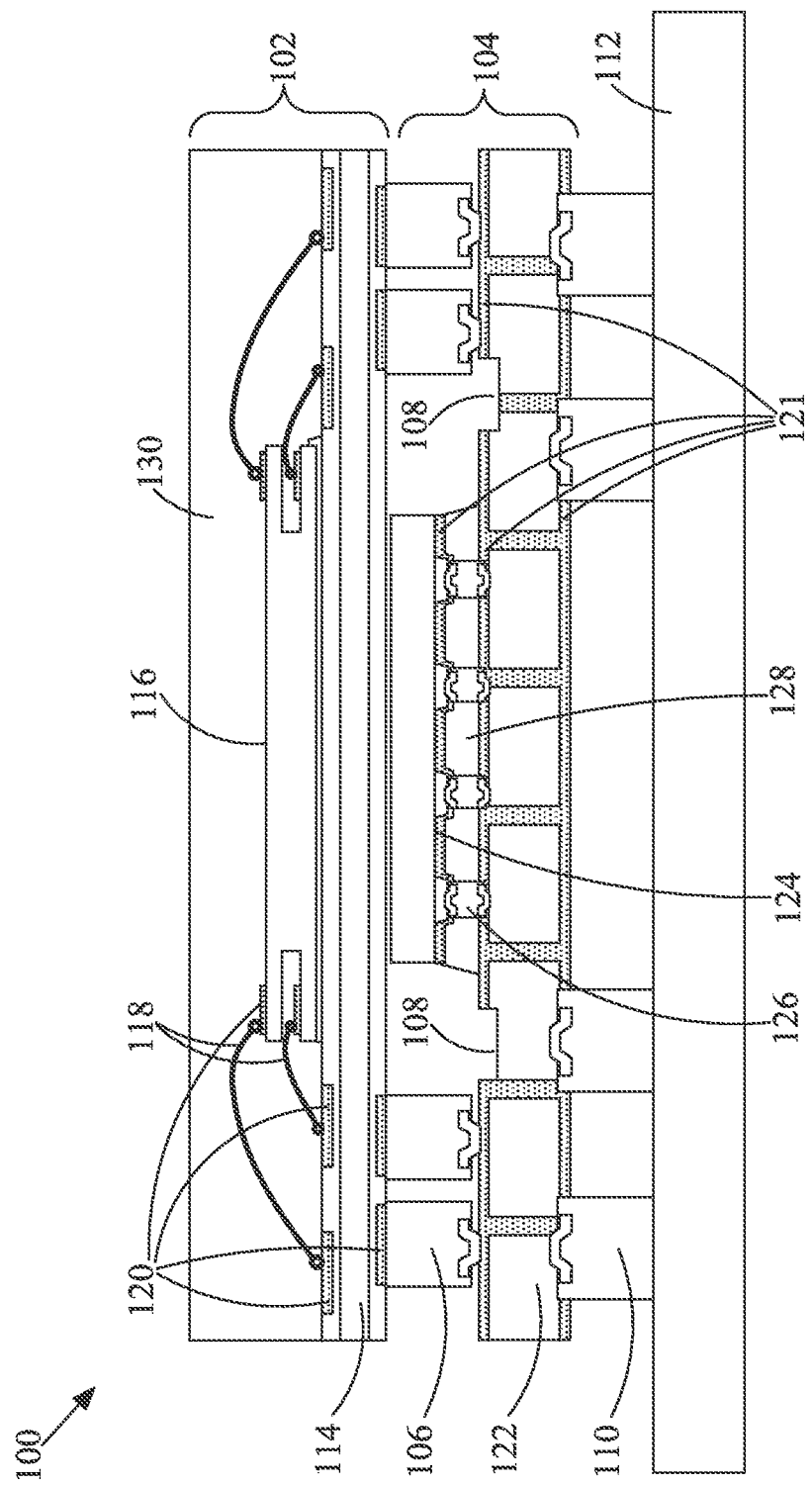
FIG. 1 is a schematic diagram of an exemplary integrated circuit underfill scheme according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic diagram of an exemplary integrated circuit 100 underfill scheme according to some embodiments. The integrated circuit 100 includes a top integrated circuit package ("top package") 102, a bottom integrated circuit package ("bottom package") 104, solder bumps (solder balls) 106 and 110 for ball grid array (BGA) packaging, and a bottom substrate 112 such as a printed circuit board (PCB). The top package 102 includes an integrated circuit die 116 in a flip chip package in this example, bond wires 118 to electrically connect the die 116 to a top substrate 114 using some pads 120 on the top substrate 114. Molding compound 130 encapsulate the die 116 and bond wires 118. Bond wires 118 and pads 120 can comprise aluminum, copper, gold, or any other suitable electrically conductive material.

The bottom package 104 includes a substrate 122 and a die 124 mounted over the substrate 122 using solder bumps 126 such as micro solder bumps (C4 bumps) for electrical connection. The substrate 122 has depressions 108 formed on the top surface of the substrate 122. The depressions 108 (one or more) are disposed around the underfill 128 to keep any spillover from the underfill 128 in the depressions 108.

The depressions 108 have a rectangular, circular, oval shape, any other shape, or any combinations thereof in some embodiments. The depressions 108 can be formed by a photolithography process in a passivation layer such as silicon dioxide, silicon nitride, or polymer that is formed on the surface on the substrate 122, for example. In some embodiments, the depressions 108 have a depth that ranges from 1 µm to 5 µm and have varying widths and lengths. The distance between the depressions 108 and the die 124 has a distance of less than 1 mm in some examples.

Figure 2A:
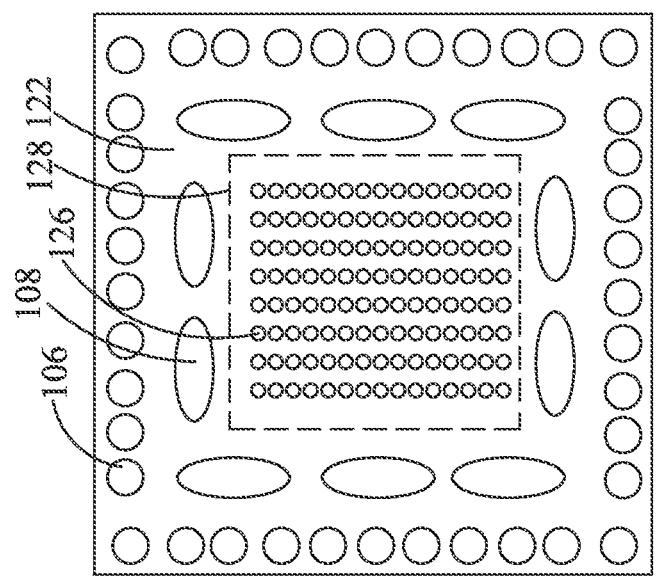
FIGS. 2A-2B are schematic diagrams of the substrate of the integrated circuit underfill scheme in FIG. 1 according to some embodiments.
Figure 2B:
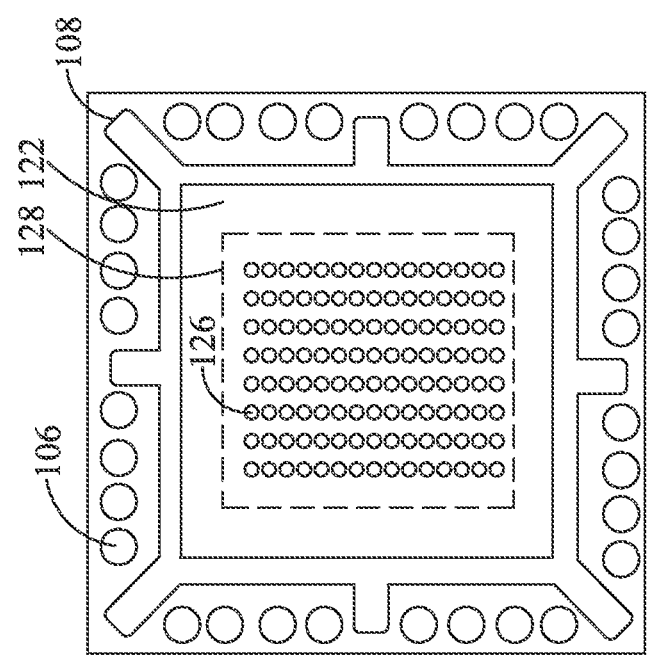

Underfill 128 (e.g., epoxy mixture) surrounds solder bumps 126 and fills the gap between the substrate 122 and the die 124. In some embodiments, the depressions 108 form a channel surrounding the underfill 128 and/or multiple depressions 108 are spread around the underfill 128 as shown in FIGS. 2A-2B, for example.

The BGA solder bumps 106 are disposed over the substrate 122 outside the underfill 128 and electrically connect the top package 102 disposed over the BGA solder bumps 106 with the substrate 122. The BGA solder bumps 110 are disposed below the substrate 122 and electrically connect the substrate 122 with the bottom substrate 112. In some embodiments, the substrate 122 is an interposer and/or the bottom substrate 112 is a PCB. Metal surfaces 121 such as redistribution layer provide electrical connections for solder bumps 106 and 110.

The solder bumps 106 and 110 can comprise SAC405, SAC105, other SnCu based materials, or any other suitable materials. The top substrate 114 and the substrate 122 can comprise organic material, Si interposer, or any other suitable material.

In one embodiment, the top package 102 has a thickness of about 500 µm with a size of about 12×12 mm, the top substrate 114 has a thickness of about 175 µm (with a size of about 12×12 mm), the substrate 122 has a thickness of about 250 µm (with a size of about 12×12 mm), the die 124 and the underfill 128 has a combined thickness of about 190 µm, and the solder bumps (BGA balls) 106 and 110 has a diameter of about 240 µm.

The depressions 108 prevent the underfill 128 from overflowing outside the intended area to keep any spillover from the underfill 128 from contaminating other non-intended areas such as solder bump 106 area (PoP pad area) on the substrate 122. The depressions 108 store any overflow from the underfill 128. The integrated circuit 100 with depressions 108 for underfill overflow control can be implemented at a relatively low cost and less process steps compared to some other underfill scheme such as forming additional underfill damming structure over the substrate 122.

FIGS. 2A-2B are schematic diagrams of the substrate 122 of the integrated circuit 100 underfill scheme in FIG. 1 according to some embodiments. In FIG. 2A, the depression 108 forms an interconnected channel surrounding the underfill 128 area. The depression 108 prevents any spillover of the underfill 128 that surrounds the solder bumps 126 (e.g., micro solder bumps for flip-chip packaging) from overflowing to other non-intended area such as the solder bump 106 area (e.g., BGA solder bumps in PoP pad area).

In FIG. 2B, multiple depressions 108 are spread around the underfill 128. The depressions 108 prevent any spillover of the underfill 128 that surrounds the solder bumps 126 (e.g., micro solder bumps for flip-chip packaging) from overflowing to other non-intended area such as the solder bump 106 area (e.g., BGA solder bumps in PoP pad area). The depressions 108 have a rectangular, circular, oval shape, any other shape, or any combinations thereof in some embodiments, and collectively form a single discontinuous ring around underfill material 128.

Figure 3:
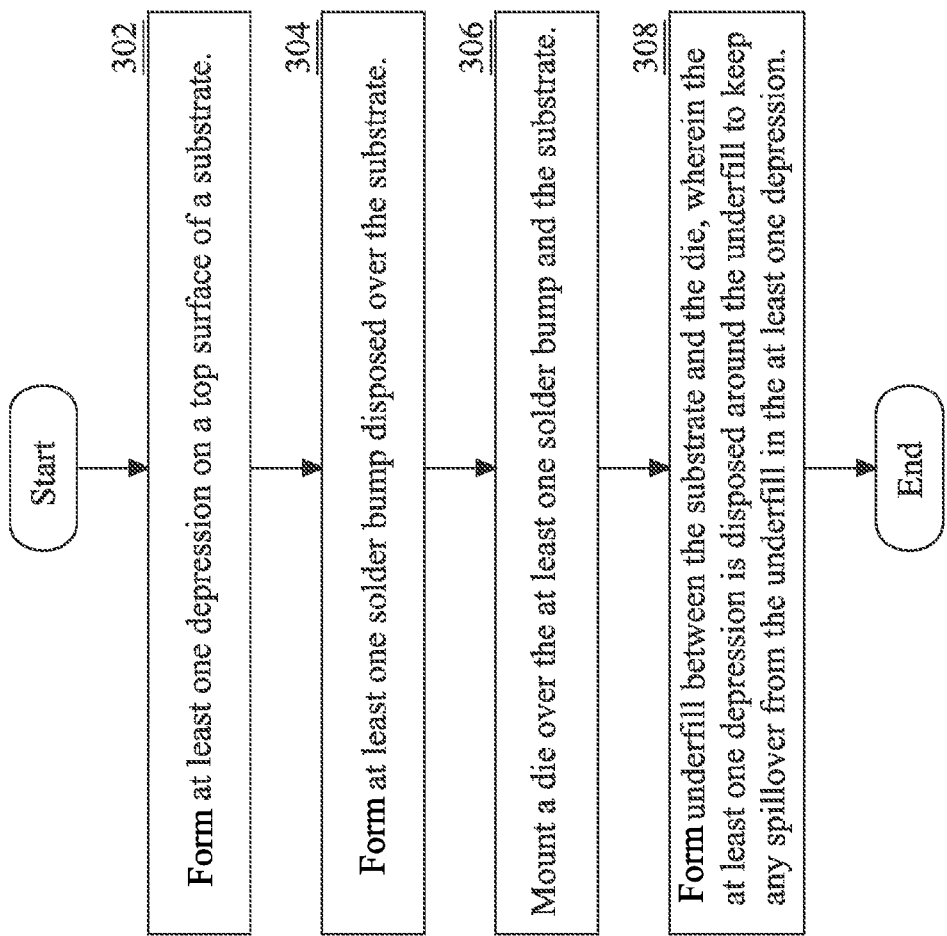
FIG. 3 is a flowchart of a method of fabricating the integrated circuit underfill scheme in FIG. 1 according to some embodiments.

FIG. 3 is a flowchart of a method of fabricating the integrated circuit 100 underfill scheme in FIG. 1 according to some embodiments. At step 302, at least one depression is formed on a top surface of a substrate. The substrate can comprise organic material, Si interposer, or any other suitable material. The depressions may form an interconnected channel and/or have a rectangular, circular, oval shape, any other shape, or any combinations thereof.

The depressions can be formed by a photolithography process in a passivation layer such as silicon dioxide, silicon nitride, or polymer that is formed on the surface on the substrate. For example, a photoresist pattern can be developed using a mask and exposure to ultra violet (UV) light. In some embodiments, the depressions have a depth that ranges from 1 μm to 5 μm and have varying widths and lengths.

At step 304, at least one solder bump is formed over the substrate. Solder bumps may be formed or placed over the substrate in many ways, including evaporation, electroplating, printing, jetting, stud bumping, and direct placement. The solder bumps can comprise SAC405, SAC105, other SnCu based materials, or any other suitable materials.

At step 306, a die is mounted over the at least one solder bump and the substrate. The distance between the depressions and the die is less than 1 mm in some examples.

At step 308, underfill is formed between the substrate and the die, wherein the at least one depression is disposed around the underfill to keep any spillover from the underfill in the at least one depression. The underfill is needle-dispensed along one or two edges of the die in some embodiments. The underfill can comprise a polymer material and silica filler, or any other suitable non-conductive material. The underfill protects the solder bumps from moisture or other environmental hazards, and provides additional mechanical strength to the package assembly. Also, the underfill may help to compensate for any thermal expansion difference between the die and the substrate to prevent a break or damage of the electrical connection of the solder bumps.

In various embodiments, at least one ball grid array (BGA) solder bump is formed over the substrate outside the underfill. A top package is mounted over the at least one BGA solder bump and the die. The substrate is mounted over a bottom substrate using at least one BGA solder bump between the substrate and the bottom substrate. The bottom substrate is a PCB in some embodiments.

According to some embodiments, an integrated circuit includes a substrate having at least one depression on a top surface. At least one solder bump is disposed over the substrate. A die is disposed over the at least one solder bump and electrically connected with the substrate through the at least one solder bump. An underfill surrounds the at least one solder bump and is formed between the substrate and the die. The at least one depression is disposed around the underfill to keep any spillover from the underfill in the at least one depression.

According to some embodiments, a method includes forming at least one depression on a top surface of a substrate. At least one solder bump is formed over the substrate. A die is mounted over the at least one solder bump and the substrate. An underfill is formed between the substrate and the die. The at least one depression is disposed around the underfill to keep any spillover from the underfill in the at least one depression.

A skilled person in the art will appreciate that there can be many embodiment variations of this disclosure. Although the embodiments and their features have been described in detail, it should be understood that various changes, substitutions, and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. An integrated circuit, comprising:
   a substrate having at least one depression on a top surface;
   at least one solder bump disposed over the substrate;
   a die disposed over the at least one solder bump and electrically connected with the substrate through the at least one solder bump; and
   an underfill surrounding the at least one solder bump and formed between the substrate and the die,
   at least two second solder bumps disposed over the substrate and outside the underfill;
   wherein the at least one depression is disposed around the underfill to keep any spillover from the underfill in the at least one depression, the at least one depression being in the form of a channel that has a first part that substantially surrounds the underfill and a second part that extends between two of the at least two second solder bumps.

2. The integrated circuit of claim 1, wherein the at least one depression forms an interconnected channel surrounding the underfill.

3. The integrated circuit of claim 1, wherein multiple depressions are spread around the underfill.

4. The integrated circuit of claim 1, wherein the at least one depression has a rectangular, circular, oval shape or any combinations thereof.

5. The integrated circuit of claim 1, wherein the at least one solder bump is a micro solder bump.

6. The integrated circuit of claim 5, further comprising at least one ball grid array (BGA) solder bump disposed over the substrate outside the underfill.

7. The integrated circuit of claim 6, further comprising a top package disposed over the at least one BGA solder bump and electrically connected with the substrate through the at least one BGA solder bump.

8. The integrated circuit of claim 1, further comprising at least one BGA solder bump below the substrate.

9. The integrated circuit of claim 8, wherein the substrate is an interposer.

10. The integrated circuit of claim 8, further comprising a bottom substrate disposed below the at least one BGA solder bump and electrically connected with the substrate through the at least one BGA solder bump.

11. The integrated circuit of claim 10, wherein the bottom substrate is a printed circuit board (PCB).

12. An integrated circuit, comprising:
a substrate having multiple depressions on a top surface;
at least one micro solder bump disposed over the substrate;
a die disposed over the at least one micro solder bump and electrically connected with the substrate through the at least one micro solder bump;
an underfill surrounding the at least one micro solder bump and formed between the substrate and the die wherein the multiple depressions collectively form a single discontinuous ring around the underfill; and
at least one ball grid array (BGA) solder bump disposed on the top surface of the substrate outside the underfill,
wherein the multiple depressions are spread around the underfill to keep any spillover from the underfill in at least one depression of the multiple depressions.

13. The integrated circuit of claim 12, wherein the multiple depressions are at least partially filled with the underfill.

14. An integrated circuit, comprising:
a substrate having at least one depression on a top surface;
at least one solder bump disposed over the substrate;
a die disposed over the at least one solder bump and electrically connected with the substrate through the at least one solder bump; and
an underfill surrounding the at least one solder bump and formed between the substrate and the die,
at least two second solder bumps disposed over the substrate and outside the underfill;
wherein the at least one depression is disposed around the underfill to keep any spillover from the underfill in the at least one depression, the at least one depression being in the form of a channel that has a first part that substantially surrounds the underfill and a second part that extends between two of the at least two second solder bumps, and
wherein the integrated circuit does not comprise a dam material.

* * * * *